United States Patent
Kilpela et al.

(10) Patent No.: US 6,820,570 B2
(45) Date of Patent: Nov. 23, 2004

(54) ATOMIC LAYER DEPOSITION REACTOR

(75) Inventors: Olli Kilpela, Helsinki (FI); Ville Saanila, Helsinki (FI); Wei-Min Li, Espoo (FI); Kai-Erik Elers, Portland, OR (US); Juhana Kostamo, Espoo (FI); Ivo Raaijmakers, Bilthoven (NL); Ernst Granneman, Hilversum (NL)

(73) Assignee: Nobel Biocare Services AG, Glattbrugg (CH)

( * ) Notice: Subject to any disclaimer, the term of this patent is extended or adjusted under 35 U.S.C. 154(b) by 0 days.

(21) Appl. No.: 10/222,005

(22) Filed: Aug. 14, 2002

(65) Prior Publication Data

US 2003/0075273 A1 Apr. 24, 2003

Related U.S. Application Data

(60) Provisional application No. 60/312,628, filed on Aug. 15, 2001.

(51) Int. Cl.[7] ..................... C23C 16/509; C23C 16/505; C23F 1/00; H01L 21/306
(52) U.S. Cl. ............... 118/723 R; 118/723 E; 118/723 I; 118/729; 156/345.43; 156/345.48; 156/345.54
(58) Field of Search .................. 118/723 E, 723 R, 118/723 ER, 723 I, 723 IR; 156/345.43, 345.44, 345.45, 345.48

(56) References Cited

U.S. PATENT DOCUMENTS

| | | | | |
|---|---|---|---|---|
| 4,134,425 A | * | 1/1979 | Gussefeld et al. | 137/625.3 |
| 4,612,432 A | * | 9/1986 | Sharp-Geisler | 219/121.43 |
| 4,851,095 A | | 7/1989 | Scobey et al. | 204/192.12 |
| 4,991,540 A | * | 2/1991 | Jurgensen et al. | 118/715 |
| 5,244,501 A | * | 9/1993 | Nakayama et al. | 118/725 |
| 5,292,370 A | * | 3/1994 | Tsai et al. | 118/723 MP |
| 5,304,279 A | | 4/1994 | Coultas et al. | 156/345.49 |

(List continued on next page.)

FOREIGN PATENT DOCUMENTS

| | | | | |
|---|---|---|---|---|
| JP | 05-198512 | * | 8/1993 | H01L/21/205 |
| JP | 10-060673 | * | 3/1998 | C23F/4/00 |
| JP | 2001-284269 | * | 10/2001 | H01L/21/205 |
| WO | 00/63957 | | 10/2000 | |
| WO | WO 00/79576 A1 | * | 12/2000 | H01L/21/205 |
| WO | 00/79578 A1 | | 12/2000 | |
| WO | 01/17692 A1 | | 3/2001 | |
| WO | 00/12964 | | 7/2001 | |
| WO | 01/00680 | | 10/2001 | |
| WO | 02/08488 A1 | | 1/2002 | |
| WO | PCT/US02/26192 | | 8/2002 | |

OTHER PUBLICATIONS

Keijser, et al., Atomic layer epitaxy of gallium arsenide with the use of atomic hydrogen. Applied Physics Letter, 58 (11), Mar. 18, 1991, p 1187–1189.

(List continued on next page.)

*Primary Examiner*—Rudy Zervigon
(74) *Attorney, Agent, or Firm*—Knobbe, Martens, Olson, & Bear, LLP.

(57) ABSTRACT

Various reactors for growing thin films on a substrate by subjecting the substrate to alternately repeated surface reactions of vapor-phase reactants are disclosed. In one embodiment, the reactor comprises a reaction chamber. A showerhead plate divides the reaction chamber into upper and lower parts. A first precursor is directed towards the lower half of the reaction chamber and a second precursor is directed towards the upper half of the reaction chamber. The substrate is disposed within the lower half of the reaction chamber. The showerhead plate includes plurality passages such that the upper half is in communication with the lower half of the reaction chamber. In another arrangement, the upper half of the reaction chamber defines a plasma cavity in which in-situ radicals are formed. In yet another arrangement, the reaction chamber includes a shutter plate, which is configured to selectively open and close the passages in the showerhead plate. In other arrangements, the showerhead plate is arranged to modify the local flow patterns of the gases flowing through the reaction chamber.

13 Claims, 14 Drawing Sheets

U.S. PATENT DOCUMENTS

| | | | | |
|---|---|---|---|---|
| 5,356,673 | A | | 10/1994 | Schmitt et al. ............. 427/446 |
| 5,370,738 | A | * | 12/1994 | Watanabe et al. ........... 118/725 |
| 5,453,305 | A | * | 9/1995 | Lee ............................ 427/562 |
| 5,669,975 | A | | 9/1997 | Ashtiani .................. 118/723 I |
| 5,724,015 | A | | 3/1998 | Tai et al. ....................... 335/78 |
| 5,767,628 | A | | 6/1998 | Keller et al. ............ 315/111.51 |
| 5,811,022 | A | | 9/1998 | Savas et al. ................... 216/68 |
| 5,831,431 | A | | 11/1998 | Gottfried-Gottfried et al. ........... 324/239 |
| 5,904,780 | A | * | 5/1999 | Tomoyasu ............ 118/723 AN |
| 5,916,365 | A | | 6/1999 | Sherman ..................... 117/92 |
| 5,942,855 | A | | 8/1999 | Hopwood .............. 315/111.51 |
| 6,036,878 | A | | 3/2000 | Collins ........................ 216/68 |
| 6,054,013 | A | | 4/2000 | Collins et al. ......... 156/345.27 |
| 6,074,953 | A | | 6/2000 | Donohoe et al. ........... 438/710 |
| 6,077,384 | A | | 6/2000 | Collins et al. ......... 156/345.29 |
| 6,113,759 | A | * | 9/2000 | Uzoh ........................ 205/157 |
| 6,114,252 | A | | 9/2000 | Donohoe et al. ........... 438/710 |
| 6,117,788 | A | | 9/2000 | Ko ............................. 438/706 |
| 6,136,720 | A | | 10/2000 | Donohoe et al. ........... 438/710 |
| 6,156,151 | A | * | 12/2000 | Komino et al. ........ 156/345.29 |
| 6,184,146 | B1 | | 2/2001 | Donohoe et al. ........... 438/710 |
| 6,184,158 | B1 | | 2/2001 | Shufflebotham et al. .... 438/788 |
| 6,200,893 | B1 | | 3/2001 | Sneh ......................... 438/685 |
| 6,263,831 | B1 | * | 7/2001 | Gorin .................... 118/723 IR |
| 6,266,712 | B1 | | 7/2001 | Henrichs ....................... 710/8 |
| 6,270,571 | B1 | | 8/2001 | Iwasaki et al. ............... 117/88 |
| 6,305,314 | B1 | | 10/2001 | Sneh et al. ............. 118/723 R |
| 6,306,216 | B1 | | 10/2001 | Kim et al. .................. 118/725 |
| 6,342,277 | B1 | | 1/2002 | Sherman ..................... 427/569 |
| 6,364,949 | B1 | | 4/2002 | Or et al. ........................ 118/69 |
| 6,368,987 | B1 | | 4/2002 | Kopacz et al. .............. 438/788 |
| 6,391,146 | B1 | * | 5/2002 | Bhatnagar et al. .......... 118/715 |
| 6,416,822 | B1 | | 7/2002 | Chiang et al. .............. 427/561 |
| 6,428,859 | B1 | | 8/2002 | Chiang et al. .............. 427/457 |
| 6,432,260 | B1 | * | 8/2002 | Mahoney et al. ...... 156/345.35 |
| 6,446,573 | B2 | | 9/2002 | Hirayama et al. ...... 118/723 M |
| 2002/0011215 | A1 | * | 1/2002 | Tei et al. ............ 118/723 MW |
| 2002/0073924 | A1 | | 6/2002 | Chiang et al. .......... 118/723 R |
| 2002/0076481 | A1 | | 6/2002 | Chiang et al. .................. 427/8 |
| 2002/0076490 | A1 | | 6/2002 | Chiang et al. ........... 427/248.1 |
| 2002/0076507 | A1 | | 6/2002 | Chiang et al. ............... 427/569 |
| 2002/0076508 | A1 | | 6/2002 | Chiang et al. .............. 427/569 |
| 2002/0104484 | A1 | | 8/2002 | Chiang et al. .............. 427/569 |
| 2002/0164421 | A1 | | 11/2002 | Chiang et al. ............ 118/723 I |
| 2002/0164423 | A1 | | 11/2002 | Chiang et al. ......... 427/255.28 |
| 2002/0197402 | A1 | | 12/2002 | Chiang et al. ......... 427/255.39 |
| 2003/0010452 | A1 | * | 1/2003 | Park et al. ............. 156/345.33 |
| 2003/0015137 | A1 | * | 1/2003 | Sakai et al. ................. 118/715 |
| 2003/0089314 | A1 | * | 5/2003 | Matsuki et al. ............. 118/715 |

OTHER PUBLICATIONS

Mahajan, et al., Si atomic layer epitaxy based on Si2H6 and remote He plasma bombardment. Thin Solid Films, 225, 1993, p 177–182.

Imai, et al., Atomic layer epitaxy of Si using atomic H. Thin solid Films, 225, 1993, p 168–172.

Koleske, et al., Atomic layer epitaxy of Si on Ge(100) using Si2Cl6 and atomic hydrogen. Applied Physics Letter.64(7), Feb. 14, 1994, p 884–886.

Sugahara, et al., Atomic layer epitaxy of geranium. Applied Surface Science 82/83 (1994) 380–386.

Sugahara, et al., Atomic hydrogen–assisted ALE of geranium. Applied Surface Science 90 (1995) 349–356.

Sugahara, et al., Modeling of geranium atomic–layer–epitaxy. Applied Surface Science, 112 (1997) 176–186.

Singh, et al., Measurements of the electron energy distribution function in molecular gases in a shielded inductively coupled plasma. Journal of Applied Physics, vol. 88 (7), Oct. 1, 2000, p 3889–3898.

Singh, et al., Measurements of neutral and ion composition, neutral temperature, and electron energy distribution function in a CF4 inductively coupled plasma. J. Vacuum Science Technology A 19(3), May/Jun. 2001.

APEX News Release, Apex Introduces Radical Assisted CVD Technology, Which Delivers Revolutionary High–Quality, Low–Temp Solutions Beyond LPCVD, PECVD Limitations. For release on Feb. 5, 2003 or later.

* cited by examiner

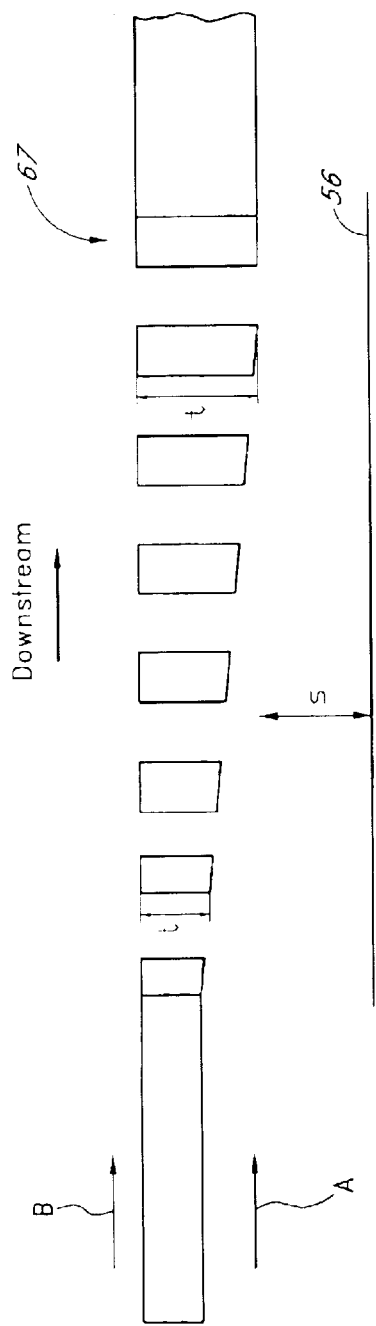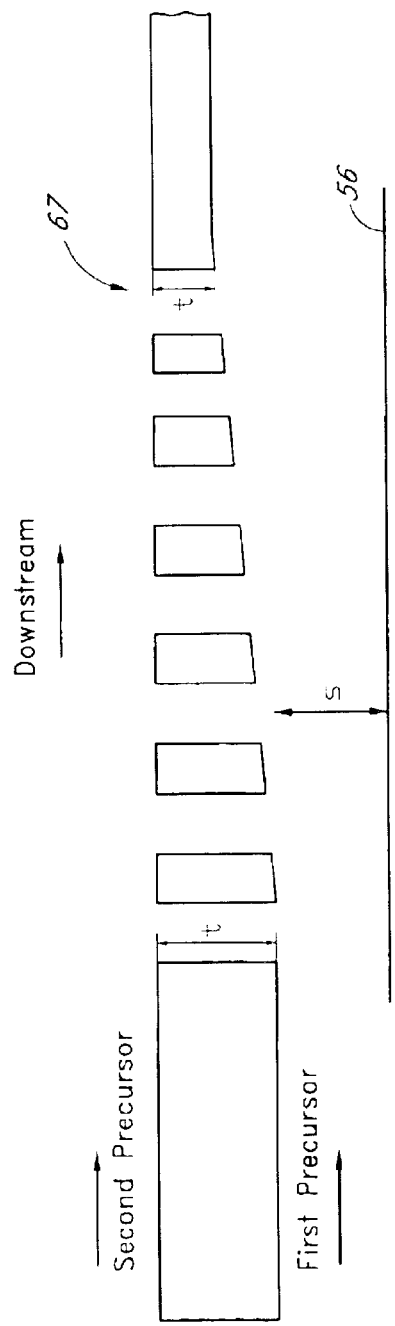

ATOMIC LAYER DEPOSITION REACTOR

RELATED APPLICATION

This application claims the priority benefit under 35 U.S.C. §119(e) of Provisional Application No. 60/312,628 filed Aug. 15, 2001.

BACKGROUND OF THE INVENTION

1. Field of the Invention

The present invention relates to an apparatus for growing thin films on a surface of a substrate. More particularly, the present invention relates to an apparatus for producing thin films on the surface of a substrate by subjecting the substrate to alternately repeated surface reactions of vapor-phase reactants.

2. Description of the Related Art

There are several methods for growing thin films on the surface of substrates. These methods include vacuum evaporation deposition, Molecular Beam Epitaxy (MBE), different variants of Chemical Vapor Deposition (CVD) (including low-pressure and organometallic CVD and plasma-enhanced CVD), and Atomic Layer Epitaxy (ALE), which was studied extensively for semiconductor deposition and electroluminescent display applications but has been more recently referred to as Atomic Layer Deposition (ALD) for the deposition of a variety of materials.

ALD is a deposition method that is based on the sequential introduction of precursor species (e.g., a first precursor and a second precursor) to a substrate, which is located within a reaction chamber. The growth mechanism relies on the adsorption of the first precursor on the active sites of the substrate. Conditions are such that no more than a monolayer forms so that the process is self-terminating or saturative. For example, the first precursor can include ligands that remain on the adsorbed species, which prevents further adsorption. Accordingly, temperatures are kept above the precursor condensation temperatures and below the precursor thermal decomposition temperatures. This initial step of adsorption is typically followed by a first purging stage wherein the excess first precursor and possible reaction byproducts are removed from the reaction chamber. The second precursor is then introduced into the reaction chamber. The first and second precursor typically react with each other. As such, the adsorbed monolayer of the first precursor reacts instantly with the introduced second precursor thereby producing the desired thin film. This reaction terminates once the adsorbed first precursor has been consumed. The excess of second precursor and possible reaction byproducts are then removed by a second purge stage. The cycle can be repeated so as to grow the film to a desired thickness. Cycles can also be more complex. For example, the cycles can include three or more reactant pulses separated by purge and/or evacuation steps.

ALD is described in Finnish patent publications 52,359 and 57,975 and in U.S. Pat. Nos. 4,058,430 and 4,389,973. Apparatuses suited to implement these methods are disclosed in U.S. Pat. No. 5,855,680, Finnish Patent No. 100,409, Material Science Report 4(7) (1989), p. 261, and Tyhjiötekniikka (Finnish publication for vacuum techniques), ISBN 951-794-422-5, pp. 253–261, which are incorporated herein by reference.

Ideally, in ALD, the reactor chamber design should not play any role in the composition, uniformity or properties of the film grown on the substrate because the reaction is surface specific. However, only a few precursors exhibit such ideal or near ideal behavior. Factors that may hinder this idealized growth mode can include: time-dependent adsorption-desorption phenomena; blocking of the primary reaction by by-products of the primary reaction (e.g., as the by-products are moved in the direction of the flow, reduced growth rate down-stream and subsequent non-uniformity may result, e.g., in $TiCl_4+NH_3 \rightarrow TiN$ process); total consumption (i.e., destruction) of the second precursor in the upstream-part of the reactor chamber (e.g., decomposition of the ozone in the hot zone); and uneven adsorption/desorption of the first precursor caused by uneven flow conditions in the reaction chamber.

Plasma ALD is a type of ALD that is a potentially attractive way to deposit conducting, semiconducting or insulating films. In this method, the ALD reaction is facilitated by creating radicals. In some prior art methods, a direct capacitive plasma is ignited above the substrate (i.e., in-situ radical generation). However, this method can result in sputtering by the plasma, which may contaminate the film as sputtered materials from parts in the reaction chamber contact the substrate. Yet another disadvantage is that, when depositing conducting materials, arcing in the chamber can occur because the insulators used to isolate the RF from ground can also become coated with the deposited conducting material.

Another prior art plasma ALD method involves creating a plasma by igniting a microwave discharge remotely (see U.S. Pat. No. 5,916,365). This has the disadvantage of requiring a large distance between the substrate and the radical source, which can lead to recombination of radicals before they reach the substrate. Additionally, in this method, the distribution of radicals is typically non-uniform and the gas flow pattern in the reactor can be ill-defined.

A need therefore exists for an improved ALD apparatus and/or method that addresses at least some of the problems described above.

SUMMARY OF THE INVENTION

Accordingly, one aspect of the present invention provides a reactor that is configured to subject a substrate to alternately repeated surface reactions of vapor-phase reactants. The reactor includes a reaction chamber that defines a reaction space. A showerhead plate is disposed within the reaction space and divides the reaction space into a first part and a second part. The showerhead plate defines at least in part plurality passages that extend from the second part to the first part of the reaction chamber. The reactor further includes a first precursor source that is in communication with the first part of the reaction space and a second precursor source that is in communication with the second part of the reaction space. The substrate is positioned within the first part of the reaction space.

In one arrangement, the showerhead plate is a single integrally formed plate. In another embodiment, the reaction chamber comprises a first section and a second section that are secured to each other through mechanical forces and the showerhead plate is supported between the first and second sections of the reaction chamber by the mechanical forces. In yet another embodiment, the showerhead plate is configured to adjust in a horizontal direction the surface reactions on the substrate. In another arrangement, the showerhead plate can have a variable thickness. In yet another arrangement, the showerhead includes a shutter plate configured to be moveable with respect to the second plate, wherein the overlap between openings in each of the plates can be changed to tailor gas flow across the substrate.

Another aspect of the present invention provides a reactor that is configured to subject a substrate to alternately repeated surface reactions of vapor-phase reactants. The reactor includes a reaction chamber that defines a reaction space. The reactor further includes a first precursor source that is in communication with the reaction space. A substrate is positioned within the reaction space. The reactor further includes an inductively coupled plasma generating power apparatus that is positioned in the reaction chamber and is arranged to generate a plasma directly above the substrate.

Yet another aspect of the present invention provides a reactor that is configured to subject a substrate to alternately repeated surface reactions of vapor-phase reactants. The reactor includes reaction chamber that defines a reaction space. A substrate is positioned within the reaction chamber. A plasma generating apparatus has an upper surface and a lower surface. The plasma generating apparatus is positioned in the reaction chamber such that a plasma is generated between the upper surface of the plasma generating apparatus and an upper wall of reaction chamber. A first precursor source is in communication with the reaction space through an inlet. A flow guide is configured to direct the first precursor over the upper surface of the plasma generating apparatus, along a side of the plasma generating apparatus and to a space between the lower surface of the plasma generating apparatus and the substrate. The first precursor flows substantially in a first direction, which is substantially parallel to the substrate.

Another aspect of the present invention is a reactor configured to subject a substrate to alternately repeated surface reactions of vapor-phase reactants. The reactor includes a reaction chamber that defines a reaction space, the reaction space comprising a first section and a second section that are secured to each other through mechanical forces. A showerhead plate is disposed within the reaction space and divides the reaction space into a first part in which the substrate is positioned and a second part. The showerhead plate defines at least in a part plurality passages that extend from the second part to the first part of the reaction chamber. The showerhead plate is supported between a groove formed, at least in part, by the first and second sections of the reaction chamber. A first precursor source is in communication with the first part of the reaction space. A second precursor source is in communication with the second part of the reaction space.

Still another aspect of the present invention provides a method for atomic layer deposition including a plurality of cycles. Each cycle comprises supplying a first precursor to a reaction space in which a substrate is disposed, allowing the first precursor to be adsorbed onto a surface of the substrate so as to form a layer of adsorbed species, removing the first precursor from the reaction space, supplying a second precursor, passing, substantially intact, the second precursor through a showerhead plate extending over the substrate, the second precursor reacting with the adsorbed species, and removing the second precursor from the reaction space.

Further aspects, features and advantages of the present invention will become apparent from the following description of the preferred embodiments.

BRIEF DESCRIPTION OF THE DRAWINGS

The above-mentioned and other features of the invention will now be described with reference to the drawings of preferred embodiments of a reactor for producing thin films on the surface of a substrate by subjecting the substrate to alternately repeated surface reactions of vapor-phase reactants. The illustrated embodiments of the reactor are intended to illustrate, but not to limit the invention.

FIG. 3A is a schematic cross-sectional side view of one embodiment of a showerhead plate having certain features and advantages according to the present invention.

FIG. 3B is a schematic cross-sectional side view of another embodiment of plate having certain features and advantages according to the present invention.

In FIG. 4A, a shutter plate is shown in an open position while in FIG. 4B the shutter plate is shown in a closed position.

DETAILED DESCRIPTION OF THE PREFERRED EMBODIMENT

Figure 1:
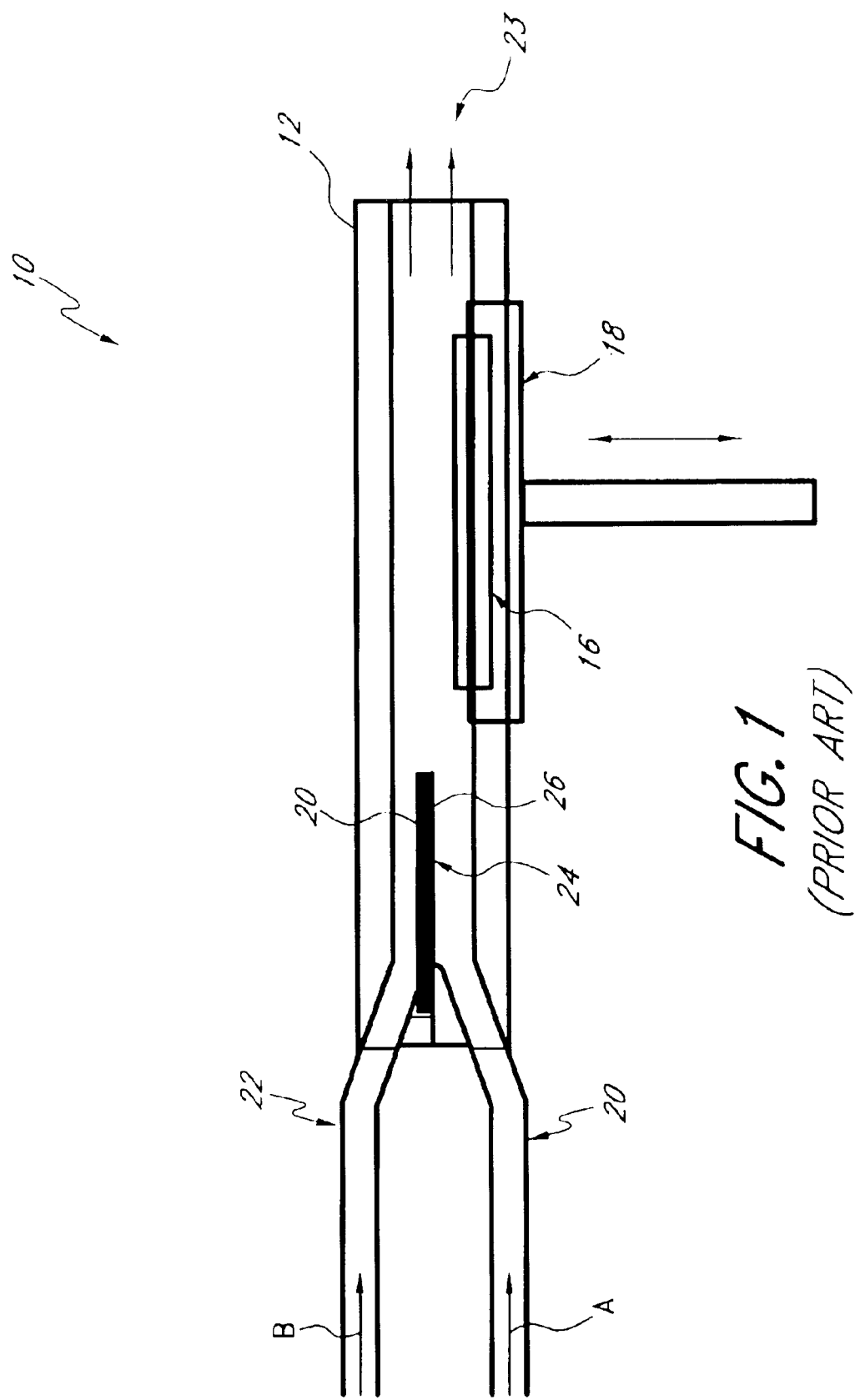
FIG. 1 is a schematic cross-sectional side view of an exemplary prior art ALD reactor.

FIG. 1 schematically illustrates an exemplary prior art ALD reactor 10. The reactor 10 includes a reactor chamber 12, which defines, at least in part, a reaction space 14. A wafer or substrate 16 is disposed within the reaction chamber 14 and is supported by a pedestal 18. The pedestal 18 is configured to move the wafer 16 in and out of the reaction chamber 14. In other arrangements, the reactor can include an inlet/outlet port and an external robot with a robotic arm. The robot arm can be configured to (i) move the substrate into the reactor through the inlet/outlet port, (ii) place the substrate on the pedestal, (iii) lift the substrate from the pedestal and/or (iv) remove the substrate from the reactor through the inlet/outlet port.

In the illustrated reactor 10, two precursors, A and B, are supplied to the reaction space 14. The first precursor A is supplied to the reaction chamber 14 through a first supply conduit 20. In a similar manner, the second precursor B is supplied to the reaction space 14 through a second supply conduit 22. The first supply conduit 20 is in communication with a first precursor supply source (not shown) and a purging gas supply source (not shown). Similarly, the second supply conduit 22 is in communication with a second precursor supply source (not shown) and a purging gas supply source (not shown). The purging gas preferably is an inert gas and may be, by way of two examples, nitrogen or argon. The purging gas is preferably also used to transport the first and/or second precursor from the supply sources to the reaction chamber 12. The purging gas may also be used to purge the reaction chamber and/or the supply conduits 20, 22 when the first or second precursor is not being supplied as will be explained in more detail below. In a modified arrangement, the reactor can include an independent, separate purge gas supply conduit for supplying the purge gas to the reaction chamber 12. An exhaust passage 23 is provided for removing gases from the reaction space 14.

A divider plate 24 typically is disposed within the reaction chamber 12. The divider plate 24 has a first side 26 and a second side 28. The divider plate 24 is generally disposed between the outlets of the first and second supply conduits 20, 22. That is, the first side 26 is generally exposed to the outlet of the first precursor supply conduit 20 while the second side 28 is generally exposed to the outlet of the second precursor supply conduit 22. The divider plate 24 provides for a uniform introduction of the first and second precursors into the reactor chamber, 12 without depleting them in reactions on the surfaces of the supply conduits 20, 22. That is, the divider plate 24 allows the reaction space 14 to be the only commons space that is alternately exposed to the first and second precursors, such that they only react on the substrate 16 in the desired manner. Because the first and second precursors can be adsorbed by the walls of the first and second supply conduit, letting the first and second supply conduit to join together into a single supply conduit upstream of the reaction space can cause continuing reactions and depositions on the walls of the supply conduits, which is generally undesirable.

The illustrated reactor 10 can be used for various IC wafers processing applications. These applications include (but are not limited to): barriers and metals for back-end processes; high- and low-dielectric materials used for gates, stacks, capacitors and thin oxides or inter-layers, respectively.

A generic operating procedure for the reactor 10 will now be described. In a first stage, the first precursor A is supplied to the reaction chamber 12. Specifically, the first precursor supply source is opened such that the first precursor A can flow through the first supply conduit 20 into the reaction chamber 12 while the second supply source is kept closed. The second precursor flow can be closed using, for example, a pulsing valve or by an arrangement of inert gas valving, such as, the arrangement described at page 8 of International Publication No. WO 02/08488, published Jan. 21, 2002, which is hereby incorporated in its entirety by reference herein. The purging gas preferably flows through both the first and second supply conduits 20, 22. During this stage, the first precursor A is adsorbed on the active sites of the substrate 16 to form an adsorbed monolayer. During a second stage, the excess first precursor A and any by-product is removed from the reactor 10. This is accomplished by shutting off the first precursor flow while continuing the flow of purge gas through the first and second supply conduits 20, 22. In a modified arrangement, purge gas can be supplied through a third supply conduit that is independently connected to the reaction 10. In a third stage, the second precursor B is supplied to the reaction chamber 12. Specifically, while the first precursor supply source remains closed, the second precursor supply source is opened. Purging gas is preferably still supplied through both the first and second conduits 20, 22. The first and second precursors are highly reactive with each other. As such, the adsorbed monolayer of the first precursor A reacts instantly with the second precursor B that has been introduced into the reaction chamber 12. This produces the desired thin film on the substrate 16. The reaction terminates once the entire amount of the adsorbed first precursor has been consumed. In a fourth stage, the excess second precursor and any by-product is removed from the reaction chamber 12. This is accomplished by shutting off the second precursor while the purging flow to both the second and first supply conduits 20, 22 remains on. The cycle described above can be repeated as necessary to grow the film to a desired thickness. Of course, purge phases can be replaced with pump down phases. It should be appreciated that the generic operating procedure described above and the arrangement of the first and second conduits 20, 22 describe above and modifications thereof can be applied to the embodiments described below.

As mentioned above, the configuration of the reaction chamber 12 should not affect the composition, uniformity or properties of the film grown on the substrate 16 because the reaction is self-limiting. However, it has been found that only a few precursors exhibit such ideal or near ideal behavior. Factors that may hinder this idealized growth mode can include: time-dependent adsorption-desorption phenomena; blocking of the primary reaction by the by-products of the primary reaction (e.g., as the by-products are moved in the direction of the flow, reduced growth rate downstream and subsequent non-uniformity may result, e.g., in $TiCl_4+NH_3 \rightarrow TiN$ process); total consumption (i.e., destruction) of the second precursor in the upstream portion of the reactor chamber (e.g., decomposition of ozone in the hot zone); and uneven adsorption/desorption of the first precursor caused by uneven flow conditions in the reaction chamber.

Figure 2:
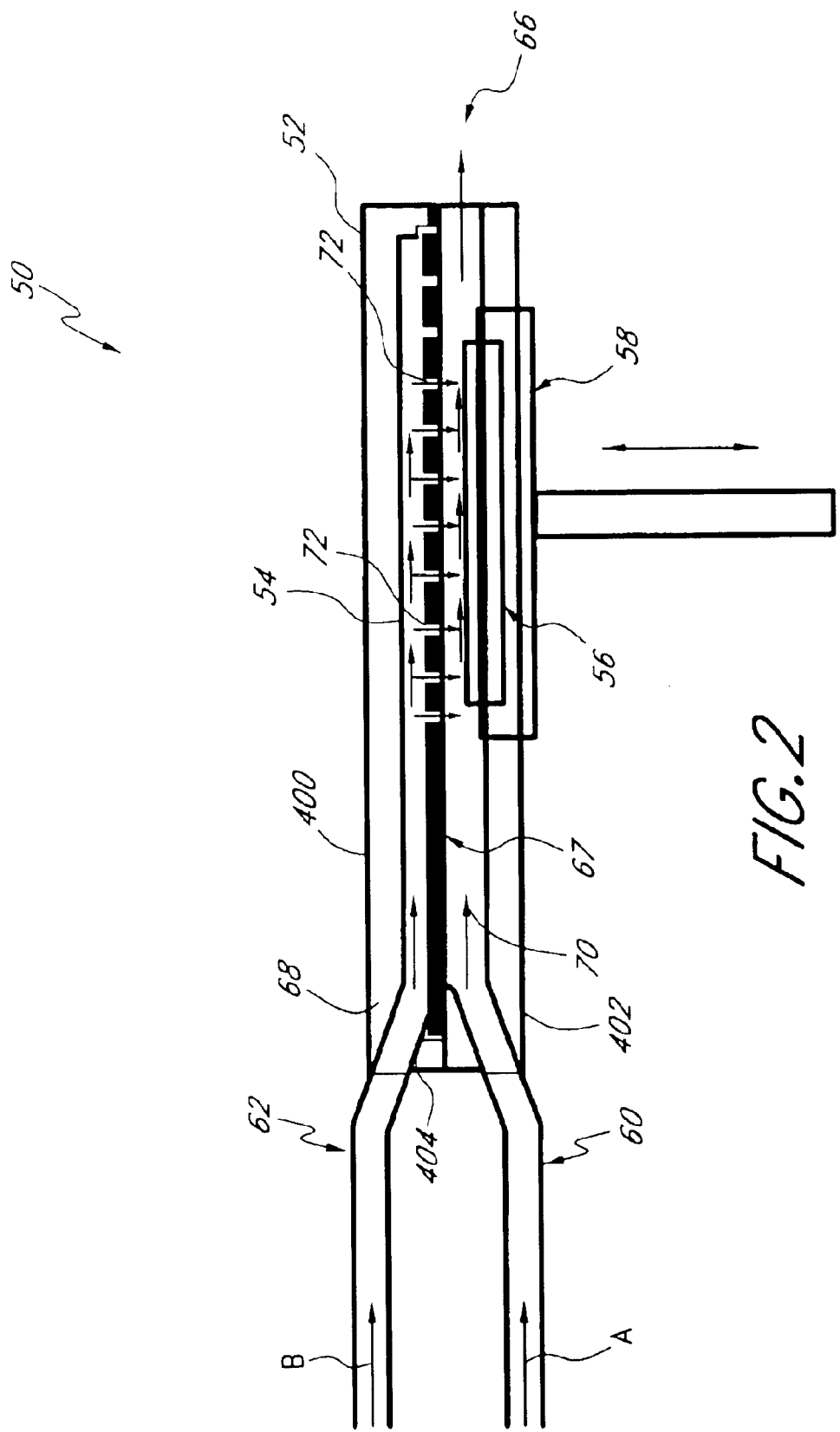
FIG. 2 is a schematic cross-sectional side view of one embodiment of an ALD reactor having certain features and advantages according to the present invention.

FIG. 2 illustrates one embodiment of an ALD reactor 50 having certain features and advantages according to the present invention. Preferably, the reactor 50 is arranged to alleviate the observed non-idealities described above. As with the reactor described above, the illustrated embodiment includes a reaction chamber 52, which defines a reaction space 54. A wafer or substrate 56 is disposed within the reaction chamber 52 and is supported by a pedestal 58, which preferably is configured to move the substrate 56 in and out of the reaction chamber 52. In a modified arrangement, the reactor 50 can include an inlet/outlet port and a external robot (not shown) with a robot arm. The robot arm can be configured to (i) move the substrate into the reactor through the inlet/outlet port, (ii) place the substrate on the pedestal, (iii) lift the substrate from the pedestal and/or (iv) remove the substrate from the reactor through the inlet/outlet port.

In the illustrated embodiment, two precursors A, B are supplied to the reaction chamber 52. The first precursor A is supplied to the reaction chamber 52 through a first precursor conduit 60. In a similar manner, the second precursor B is supplied to the reaction chamber 52 through a second precursor supply conduit 62. Each supply conduit is connected to a precursor supply source (not shown) and preferably a purge gas source (not shown). The purge gas is an inert gas and can be, by way of example, nitrogen or argon. The purge gas can also be used to transport the first and/or second precursors. The reactor 50 also includes an exhaust 66 for removing material from the reactor chamber 52.

A showerhead plate 67 is positioned within the reaction chamber 52. Preferably, the showerhead plate 67 is a single integral element. The showerhead plate 67 preferably spans across the entire reaction space 54 and divides the reaction space 54 into an upper chamber 68 and a lower chamber 70. In modified embodiments, the showerhead plate 67 can divide only a portion of the reaction space 54 into upper and lower chambers 68, 70. Preferably, such a portion lies generally above the substrate 56 and extends towards a space between the outlets of the first and second conduits 60, 62.

The showerhead plate 67 defines, at least in part, a plurality of passages 72 that connect the upper chamber 68 to the lower chamber 70. In the illustrated embodiment, such passages 72 are formed by providing small holes in the showerhead plate 67 that are located generally above the substrate 56. In this manner, the showerhead plate 67 substantially prevents the second precursor B from entering the lower chamber 70 until the flow from the second conduit 62 is generally above the substrate 56.

As mentioned above, showerhead plate 67 is preferably made from a single element that spans across the entire reaction space 54. In such an embodiment, the showerhead plate 67 can be supported by providing a tightly fitting machined space 404 between upper and lower parts 400, 402 of the reaction chamber 52. The showerhead plate 67 can thus be kept in place by the positive mechanical forces inflicted on it by the opposing sides of the upper and lower parts. That is, the showerhead plate 67 is clamped between the relatively moveable upper and lower parts 400, 402 of the reaction chamber 52 and additional fixtures are not required to secure the showerhead plate in place. In other embodiments, the showerhead plate 67 can be made from a plurality of pieces and/or be supported in other manners, such as, for example, by supports positioned within the reaction chamber 52.

In general, the passages 72 are configured to provide for a uniform distribution of the second precursor B onto the substrate 56. In the illustrated embodiment, the passages 72 are uniformly distributed over the substrate 56. However, in other arrangements, the pattern, size, shape and distribution of the passages 72 can be modified so as to achieve maximum uniformity of the second precursor B at the substrate surface. In still other embodiments, the pattern, size, shape and distribution can be arranged so as to achieve a non-uniform concentration of the second precursor B at the substrate, if so required or desired. The single element showerhead plate 67 describe above is particularly useful because the showerhead plate 67 can be easily replaced and exchanged. For example, in the embodiment wherein the showerhead plate is clamped between the upper and lower of the reaction chamber 52, the showerhead plate 67 can be removed by separating the upper and lower portions of the reaction chamber 52, as is conducted during normal loading and unloading procedures in operation. Therefore, if desired or required, a showerhead plate 67 with a different pattern, distribution and/or size of passages can be easily replaced. Routine experiments may, therefore, be easily performed to determine the optimum pattern, distribution and/or size of the passageway. Moreover, such showerhead plates can be relatively easy and cost effective to manufacture.

In a modified embodiment having certain features and advantages according to the present invention, the showerhead plate can be used to modify the flow patterns in the reaction chamber 52. An example of such an embodiment is illustrated in FIG. 3A. In this embodiment, the showerhead plate 67 has a variable thickness t. That is, the thickness t of the showerhead plate 67 increases in the downstream direction. As such, the flow space s between the substrate 56 and the showerhead plate 67 decreases in the downstream direction. As the flow space s changes, the governing flow conditions at the substrate 56 also change the growth rate at various positions across the substrate 56. Such arrangements and/or modifications thereof, are thus capable of also reducing any non-uniformities of the growth rate at the substrate surface. For example, non-uniformities introduced by horizontal flow of the first precursor can be compensated in this manner.

In other embodiments, the showerhead plate can be arranged such that the distance between the showerhead plate and the substrate vary in a different manner than the embodiment shown in FIG. 3A. For example, as shown in FIG. 3B, the flow space s can increase in the downstream direction. In other embodiments, this flow space s can vary across the reaction chamber (e.g., the distance between the substrate 56 and the showerhead plate 67 can be greater near the side walls of the reaction chamber 52.). In still other embodiments, the distance between the showerhead plate and the substrate can increase and then decrease or vice versa. In yet still other embodiments, the distance from between the showerhead plate and the top of the reaction chamber can be varied in addition to or alternatively to the variations described above.

Figure 4A:
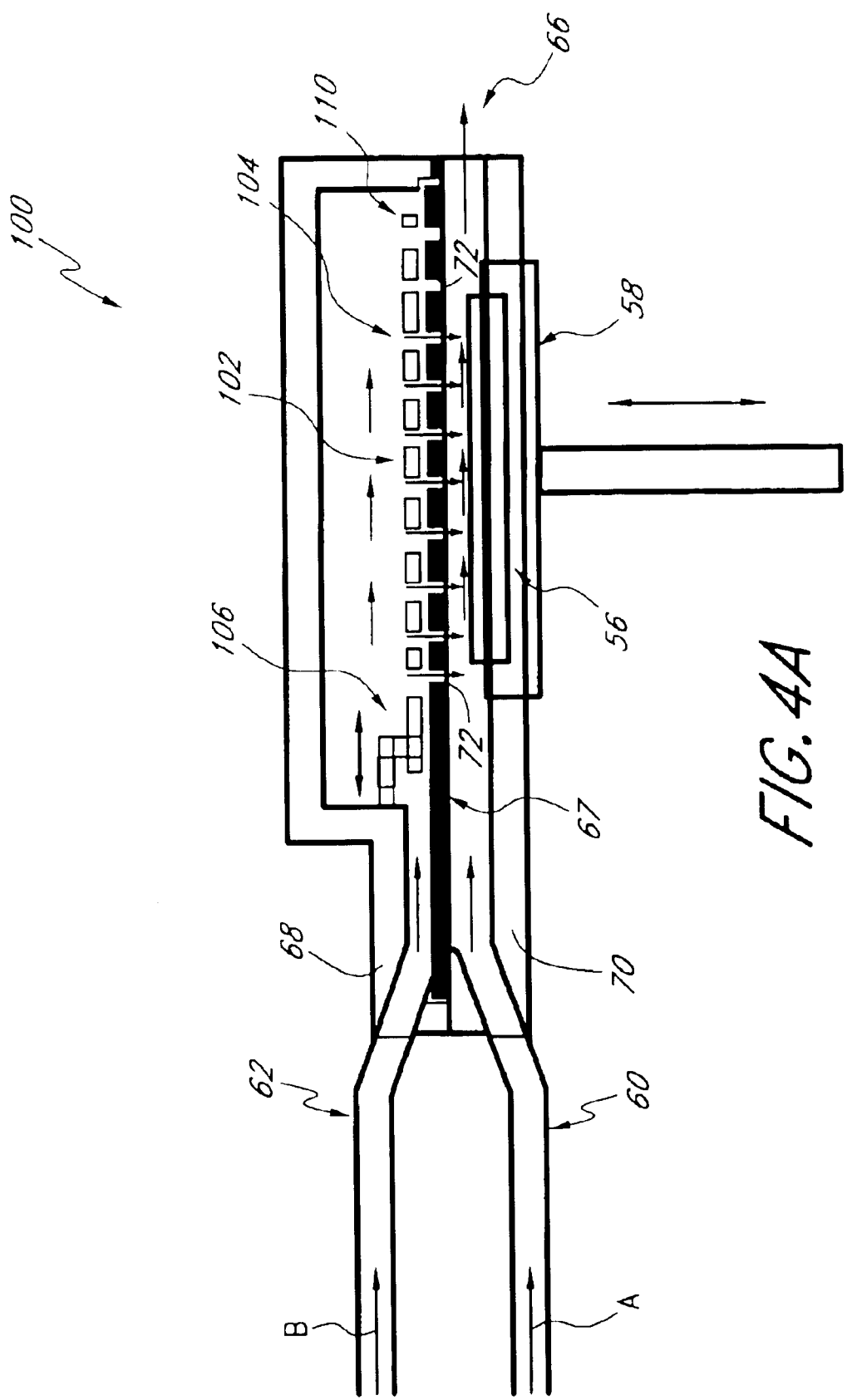
FIGS. 4A–B are cross-sectional side views of another embodiment of an ALD reactor having certain features and advantages according to the present invention.

In another modified embodiment, an ALD reactor 100 includes a shutter plate 102, which is arranged to control the flow through the passages 72 of the showerhead plate 67. FIG. 4A illustrates an example of such an embodiment wherein like numbers are used to refer to parts similar to those of FIG. 2. In the illustrated embodiment, the shutter plate 102 is disposed adjacent and on the top of the showerhead plate 67. Preferably, at least the opposing faces of the shutter plate 102 and the showerhead plate 67 are highly planar and polished. The shutter plate 102 has plurality passages 104, which preferably are situated in the same or similar pattern as the corresponding passages 72 in the showerhead plate 67. In modified embodiment, the shutter plate 102 can be placed below the showerhead plate 67.

Figure 4B:
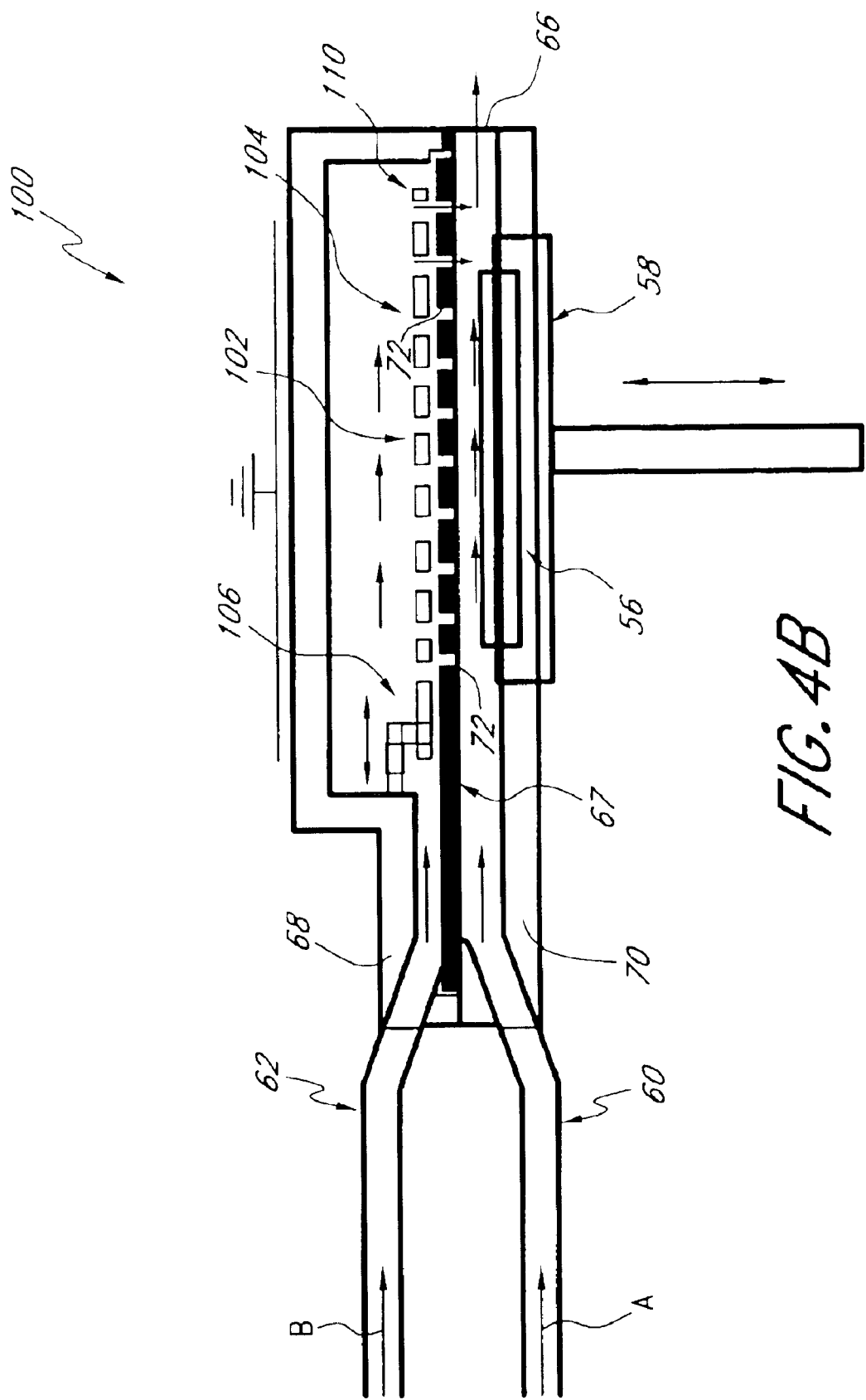

The shutter plate 102 is mechanically coupled to an actuator element 106 such that it can move relative to the showerhead plate 67, preferably in an x-y plane. In the illustrated embodiment, the actuator 106 is configured to move the shutter plate 102 in the x-direction. The actuator 106 can be in many forms, such as, for example, piezoelectric, magnetic, and/or electrical. As shown in FIG. 4B, the shutter plate 102 can be used to block or open the passages 72, 104 in both the shutter plate 102 and showerhead plate 67 depending on the position of the shutter plate 102 with respect to the showerhead plate 67. Preferably, one or more by-pass passages 110 are provided at the downstream end of the shutter plate 102 and the showerhead plate 67 such that when the shutter plate 102 is in a closed position (FIG. 4B) gases in the upper part 68 of the reaction chamber can escape to through the exhaust 66. The by-pass passage 110 is preferably closed when the shutter plate 102 is in the open position, as shown in FIG. 4A.

Figure 5A:
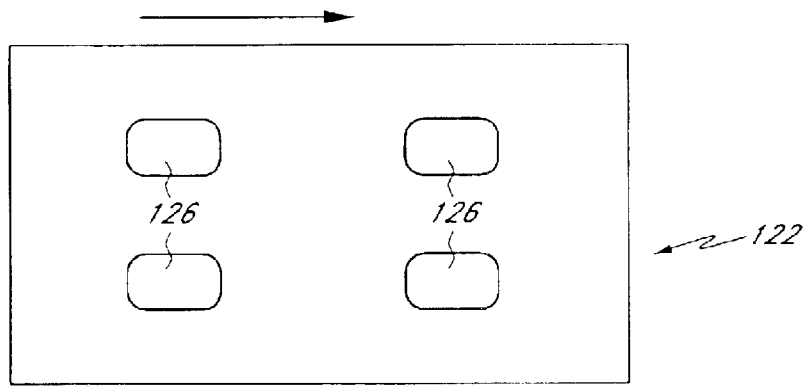
FIG. 5A is a top plan view of one embodiment of a showerhead plate having certain features and advantages according to the present invention.
Figure 5B:
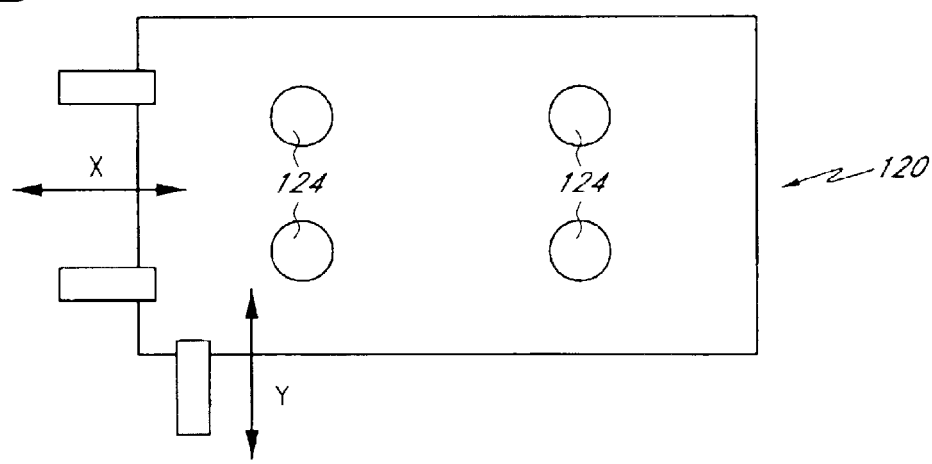
FIG. 5B is a top plan view of one embodiment of a shutter plate having certain features and advantages according to the present invention.

FIGS. 5A and 5B illustrate one embodiment of a shutter plate 120 (FIG. 5B) and a showerhead plate 122 (FIG. 5A) having certain features and advantages according to the present invention. In this embodiment, passages 124, 126 of the shutter plate 120 and the showerhead plate 122 are geometrically off-set from each other so as to vary the distribution of gas onto the substrate. As such, by controlling the position of the shutter plate 120 in the x-y plane, the feed rates of the second precursor can progressively and spatially (in an x-y-plane) be varied with respect to the substrate. More specifically, the feed rate can vary from 0–100% at the front part (upstream) of showerhead plate 122 (i.e., the x-direction or flow direction) to 100%–0 at the back part (downstream). A similar type of control is also possible in the side direction (i.e., the y-direction or crosswise flow direction) with refined geometrical designs. Of course those of skill in the art will recognize that the precise details of the geometrical shapes of the holes in the shutter plate and showerhead plate can varied, and that the principle can be readily extended to more or less than four passages per plate.

Figure 6A:
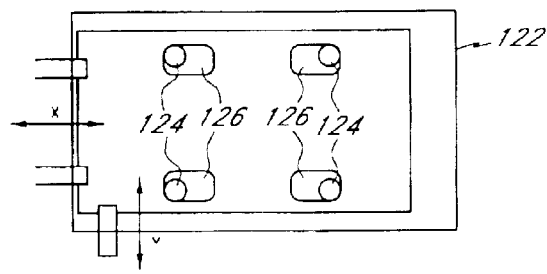
FIGS. 6A–F are top plan views of various positions of the showerhead plate and shutter plates of FIGS. 5A and 5B.
Figure 6B:
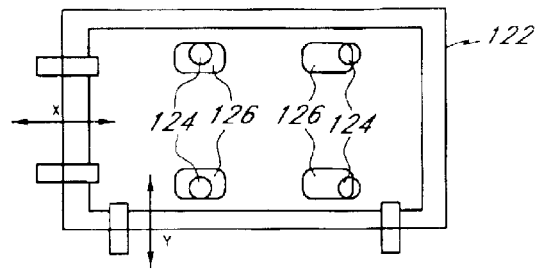
Figure 6C:
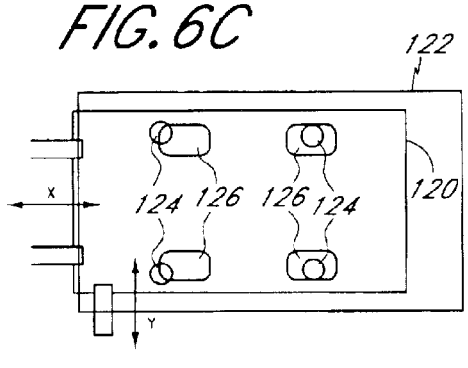
Figure 6D:
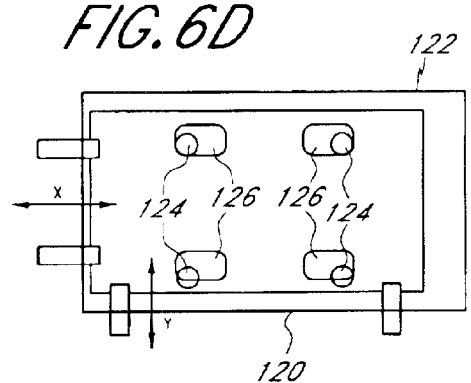
Figure 6E:
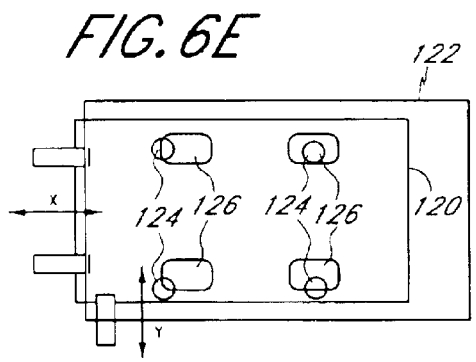
Figure 6F:
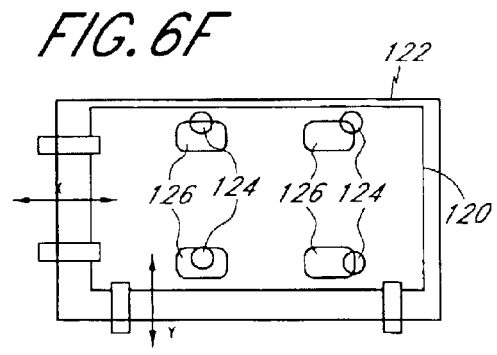

FIGS. 6A–F illustrate the various configurations that can be achieved using the off-setting passages of the plates illustrated in FIGS. 5A–B. In FIG. 6A, the shutter plate 120 is arranged such that the passages 124 are open 100%. In FIG. 6B, the passages 124 at the front of the plate 120 are open 100% and passages 124 at the back end of the plate 120 are only 50% open. In FIG. 6C, the passages 124 at the front of the plate 120 are 50% open while the passages 124 at the back end of the plate 120 are 100% open. In FIG. 6D, the passages 124 at the left-hand side of the plate 120 are 50% open while the passages 124 at the right hand side of the plate 120 are 100% open. In FIG. 6E, the front left passage 124 is 50% open, the front right passage 124 is 25% open, the rear left passage 124 is 100% open and the rear right passage 124 is 50% open. In FIG. 6F, the front left passage 124 is 50% open, the front right passage 124 is 100% open, the rear left passage 124 is 25% open and the rear right passage 124 is 50% open.

With the arrangement described above, the flow within the reactor 100 (see FIGS. 4A–B) can be tailored to compensate for non-uniformities in the reaction process. Specifically, by adjusting the position of the shutter plate 120 several different flow patterns can be achieved to compensate for the non-uniformities in the reaction process.

In a modified arrangement, the shutter plate can be arranged so as to move in a vertical (i.e., z-direction). In such an arrangement, the shutter plate need not have apertures and the plate can be used to alternately open and close the passages in the showerhead plate.

It should be appreciated that the shutter plate arrangements described above can be used in combination or sub-combination with the embodiments discussed above with reference to FIGS. 2A–3B and the embodiments described below.

Figure 7A:
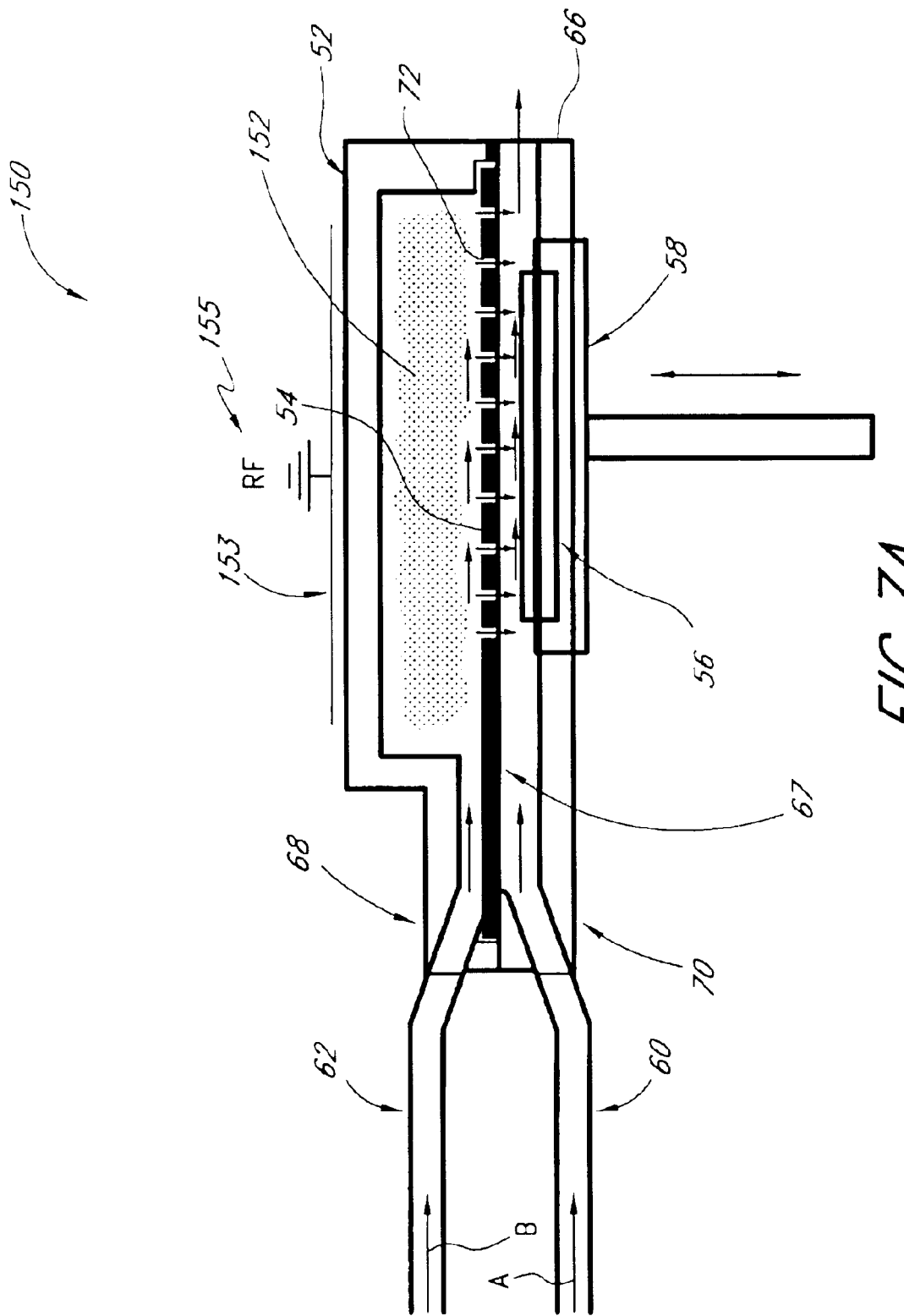
FIG. 7A is a cross-sectional side view of another embodiment of an ALD reactor having certain features and advantages according to the present invention.

FIG. 7A illustrates another embodiment of an ALD reactor 150 having certain features and advantages according to the present invention. In this embodiment, the reaction chamber 52 defines a separate plasma cavity 152 for creating in-situ radicals or excited species. As mentioned above, in-situ radicals or excited species can be used to facilitate reactions on the surface of the substrate. To create the in-situ radicals or excited species, a plasma can be created within the plasma cavity 152 in a variety of ways, such as, for example, using a capacitor electrode positioned inside or outside the plasma cavity (i.e., a capacitively coupled plasma), a RF coil (i.e., a inductively coupled plasma), light, microwave, ionizing radiation, heat (e.g., heated tungsten filament can be used to form hydrogen radicals from hydrogen molecules), and/or chemical reactions to generate the plasma.

In the embodiment illustrated in FIG. 7A, the capacitor electrode 153 is connected to an RF power source 155 and is positioned outside the reaction chamber 52 and the plasma cavity 152. The showerhead plate 67 is positioned between the plasma cavity 152 and the substrate 56 and, in the illustrated embodiment, is also used as the other electrode for capacitive coupling. This embodiment has several advantages. For example, even if the radicals are very short-lived, the path to the growth surface (i.e., on the substrate 56) is short enough to guarantee their contribution to the growth reaction. Also the plasma chamber 152 can be made large enough to provide necessary space for plasma ignition and also to separate the plasma from the growth surface, thus protecting it from the damaging effects of the energetic particles and charges in the plasma. An example of another advantage is that the plasma cavity 152 is exposed only to one type of precursor and, therefore, a thin film does not grow on the inner surfaces of the plasma cavity 152. Thus, the plasma cavity 152 stays clean for a longer time.

In one embodiment, the first precursor A, which is adsorbed onto the surface of the substrate 56, is not directly reactive with the second precursor B. Instead, the first precursor A is reactive with the excited species of the second precursor B, which are generated in the plasma cavity 152 (e.g., $N_2$, which can be non-reactive with an adsorbed species while N radicals are reactive with the adsorbed species). In a modified embodiment, the first precursor A is reactive with a recombination radical, which may be generated in the plasma cavity 152 or downstream of the plasma cavity 152. In either embodiment, the flow of the second precursor B through the second supply conduit 62 can be kept constant while the creation of plasma in the plasma cavity is cycled on and off. In a modified embodiment, the method of cycling the plasma cavity on and off can also be used with a modified reactor that utilizes a remote plasma cavity. In still another embodiment, the reactor 150 described above can be operated in a manner in which the flow of the second precursor is cycled on and off (or below an effective level) while the power for the plasma generation is kept on.

Figure 7B:
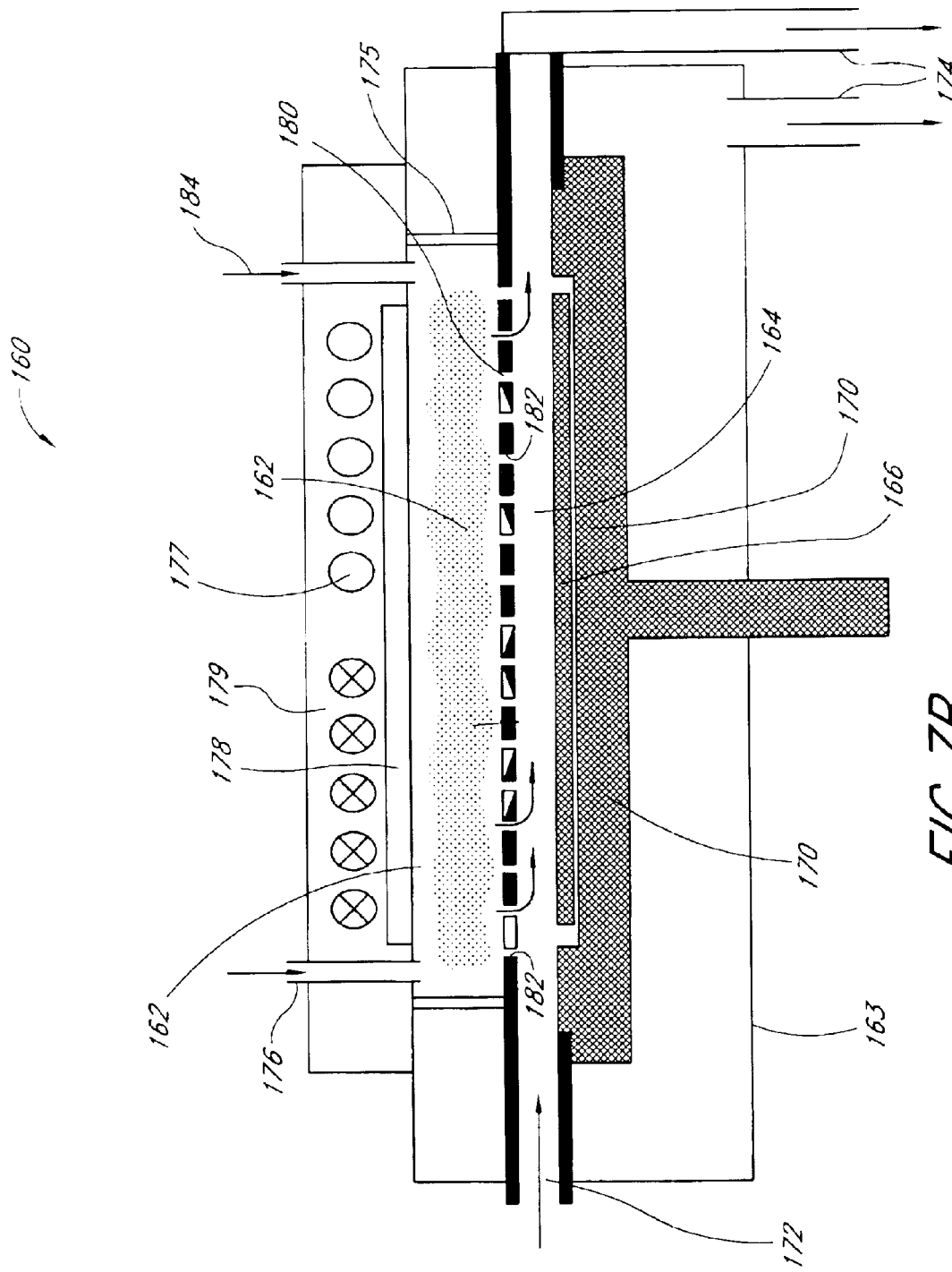
FIG. 7B is a cross-sectional side view of yet another embodiment of an ALD reactor having certain features and advantages according to the present invention.

FIG. 7B illustrates a modified embodiment of a reactor 160 that also utilizes a plasma cavity 162. In this embodiment, the reactor 160 includes a reaction chamber 163, which defines a reaction space 164. A substrate 166 is positioned within the reaction space 164 and is supported by a susceptor 170, which can be heated. A first precursor is introduced into the reaction space via a first supply conduit 172. Preferably the first supply conduit 172 and the reaction chamber 163 are arranged such that the flow of the first precursor within the reaction chamber is generally parallel to a reaction surface of the substrate 166. An exhaust 174 and a pump (not shown) are preferably provided for aiding removal of material from the reaction chamber 163.

The reactor 160 also includes a plasma chamber 175, which, in the illustrated embodiment, is located generally above the reaction space 164. The plasma chamber 175 defines the plasma cavity 162 in which the in-situ excited species or radicals are generated. To generate the radicals, a second precursor is introduced into the plasma cavity 162 via a second supply conduit 176. Radicals or other excited species flow from the plasma that is generated in the plasma chamber 175. To generate the plasma, the illustrated embodiment utilizes an RF coil 177 and RF shield 179, which are separated from the plasma cavity 162 by a window 178 made of, for example, quartz. In another embodiment, the plasma is advantageously generated using a planar induction coil. An example of such a planer induction coil is described in the Journal of Applied Physics, Volume 88, Number 7, 3889 (2000) and the Journal of Vacuum Science Technology, A 19(3), 718 (2001), which are hereby incorporated by reference herein.

The plasma cavity 162 and the reaction space 164 are separated by a radical or showerhead plate 180. The showerhead plate 180 preferably defines, at least in part, plurality passages 182 through which radicals formed in the plasma cavity can flow from into the reaction space 164. Preferably, the flow through the passages 182 is generally directed towards the reaction surface of the substrate 166. In some embodiments, the space between the showerhead plate 180 and the substrate 166 can be as small as a few millimeters. Such an arrangement provides ample radical concentration at the wafer surface, even for short lived radicals.

In the illustrated embodiments, purge gases can be continuously supplied to the plasma cavity through a purge inlet 184. In such an embodiment, the plasma chamber 175 can operate at a substantially constant pressure regime.

In the illustrated embodiments, the showerhead plate 180 and surrounding components adjacent to the reaction chamber 163 may be heated, either as a result of the plasma on one side on the showerhead plate 180 and/or a heated susceptor 170 on the other side, or by separately heating the showerhead plate 180.

In some embodiments, the RF power can be used to alternately switch the radical concentration in the flow. In other embodiments, precursors supply to the plasma cavity can be alternately switched. Preferably, there is a continuous flow from the plasma cavity 162 to the reaction space 164. Continuous flow of gases, i.e., radicals alternated with inert gas, is preferred because it prevents the first precursor in the reaction space 164 below from contaminating the plasma cavity 162. This facilitates the deposition of conducting compounds without arcing. There is also preferably a positive pressure differential between the plasma cavity 162 and the reaction space 164, with the pressure in the plasma cavity 162 being larger. Such an arrangement also promotes plasma ignition in the plasma chamber 175.

Figure 7C:
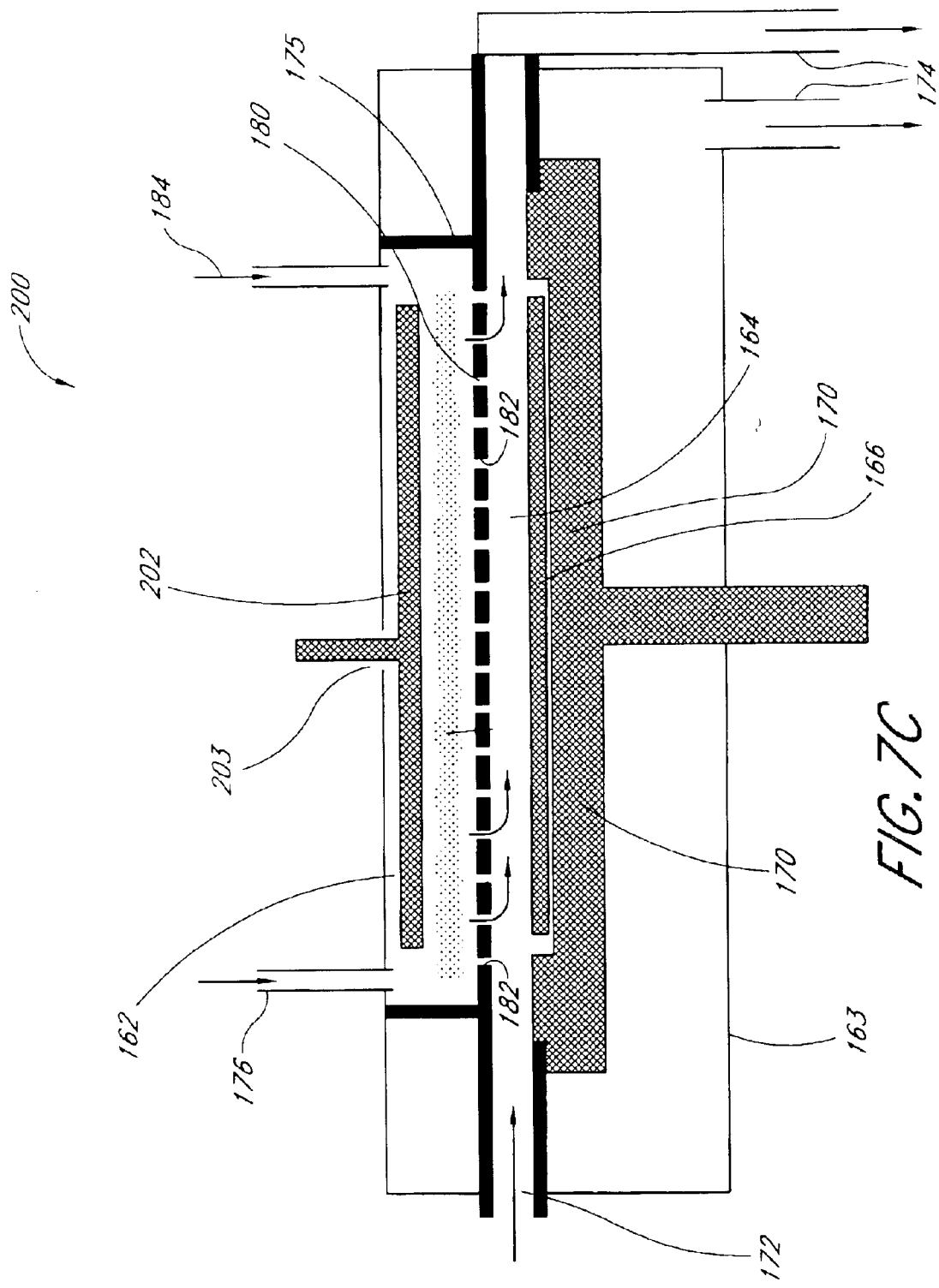
FIG. 7C is a cross-sectional side view of still another embodiment of an ALD reactor having certain features and advantages according to the present invention.

FIG. 7C illustrates another modified embodiment of a ALD reactor 200 that also utilizes a plasma cavity. Like numbers (e.g., 162, 163, 166, 170, 174, 176, 184, etc.) are used to refer to parts similar to those of FIG. 7B. In this embodiment, the plasma in the plasma cavity 162 is capacitively coupled. As such, the illustrated embodiment includes a capacitor electrode 202, which is connected to an RF source (not shown) through an RF feed through 203 and is disposed in the plasma cavity 162 above the showerhead plate 180. This arrangement is similar to the arrangement shown in FIG. 7A, except that the electrode is positioned inside the reaction chamber 163.

Some aspects of the embodiments discussed above with reference to FIGS. 7A–7C can also be used with a CVD reactor (e.g., a reactor that utilizes alternate deposition and densification to create thin films). A known problem with CVD and/or pulsed plasma CVD of conducting films is arcing. The introduction of the showerhead plate, which separates the plasma generation space (i.e., the plasma cavity) from the CVD environment (i.e., the reaction space), reduces such arcing. Unlike conventional remote plasma processors, however, the separated plasma cavity remains immediately adjacent the reaction space, such that radical recombination is reduced due the reduced travel distance to the substrate. In such an embodiment the wafer preferably is negatively biased with respect to the plasma to create ion bombardment. This embodiment may also be used to create new CVD reactions, which are temporarily enabled with radicals. Such reaction may take place in the gas phase. If the time of the RF pulse to generate radicals is short enough, such reactions will not result in large particles. Such a method may result in new film properties.

For the embodiments discussed above with reference to FIGS. 7A–C, the shape and local current density of the coil, and the shape of the quartz window can be tailored to tune various aspects of the reaction process, such as, for example, uniformity, speed of deposition, and plasma ignition. In some embodiments, a magnetic field may be used to shape and confine the plasma to suppress wall erosion and promote film uniformity. The size, shape, placement and orientation of the passages in the showerhead plate can also be tuned to optimize, for example, film properties, speed of deposition, and plasma ignition. In a similar manner, the distance between showerhead plate and substrate can be used to select which radicals will participate in the reaction. For example, if a larger distance is chosen, short-lived radicals will not survive the longer diffusion or flow path. Moreover, at higher pressures less radicals will survive the transit from showerhead plate to the substrate.

Certain aspects described above with respect to FIGS. 7A–C can also be used to introduce radicals in the reaction chamber for wall cleaning and/or chamber conditioning, such as those originating from an $NF_3$ plasma.

The embodiments discussed above with reference to FIGS. 7A–C have several advantages. For example, they provide for uniform concentration of radicals of even short-lived species over the entire substrate. The shape and flow pattern in the reactor can be optimized independently from the RF source, giving great flexibility in designing the reactor for short pulse and purge times. Plasma potentials are low, as a higher pressure can be used in the radical source than in the reaction chamber, and the plasma is inductively coupled. Therefore, sputtering of wall components is less of a concern. Inductively coupled discharges are very efficient. The separation of plasma volume and reaction volume will not cause arcing problems when metals, metalloids, or other materials that are good electrical conductors, such as transition metal nitrides and carbides, are deposited. These embodiments also can provide an easy method of chamber cleaning and/or conditioning.

It should also be appreciated that features of the embodiments discussed above with reference to FIGS. 7A–C can be combined with features of the embodiments discussed above with reference to FIGS. 3A–6F.

Figure 8:
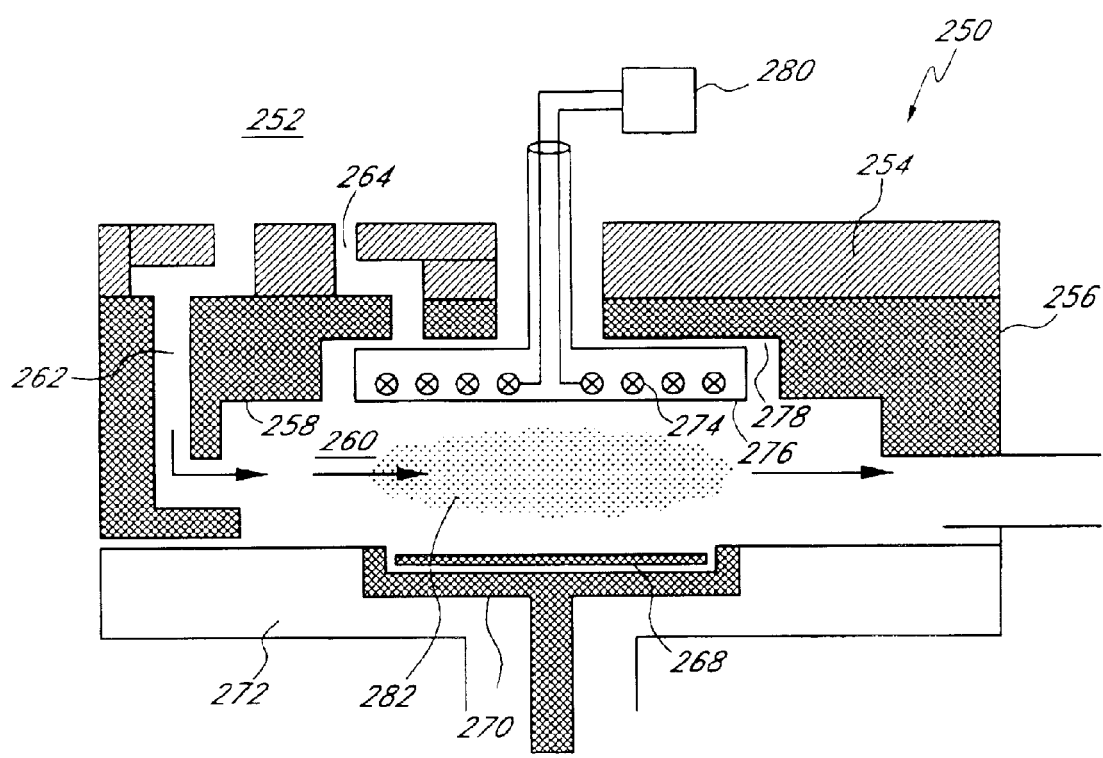
FIG. 8 is a cross-sectional side view of a plasma enhanced ALD reactor having certain features and advantages according to the present invention.

FIG. 8 is another embodiment of a plasma-enhanced modified ALD reactor 250. The reactor 250 is preferably positioned within a sealed environment 252 and comprises an upper member 254 and a lower member 256. The members 254, 256 are preferably made of an insulating material (e.g., ceramic).

The lower member 256 defines a recess 258, which forms, in part, a reaction chamber 260. A precursor inlet 262 preferably extends through the upper and lower members 254, 256 to place the reaction chamber 260 in communication with a precursor source (not shown). In a similar manner, a purge gas inlet 264 extends through the upper and lower members 254, 256 to place a purge gas source in communication with the reaction chamber 260. An exhaust 266 is also provided for removing material from the reactor chamber 260. Although not illustrated, it should be appreciated that reactor 250 can include one or more additional precursor inlets 262 for supplying additional precursors to the reaction chamber 260. In addition, the purge gas may be supplied to the reaction chamber through one of the precursor inlets.

A substrate 268 is positioned on a susceptor 270 in the reaction chamber 260. In the illustrated embodiment, the susceptor 270 is positioned within a susceptor lift mechanism 272, which may also include a heater for heating the substrate 270. The susceptor lift mechanism 272 is configured to move the substrate 268 into and out of the reaction chamber 260 and to engage the lower member 256 to seal the reaction chamber 260 during processing.

An RF coil 274 is preferably positioned within a quartz or ceramic enclosure 276. In the illustrated embodiment, the RF enclosure 276 and coil 274 are positioned within a second recess 278 (within the first recess 258) formed in the lower member 256. The recess 278 is arranged such that the RF coil 274 is positioned generally above the substrate 268. The coil 274 is connected to an RF generator and matching network 280 such that an inductively coupled plasma 282 can be generated in the reaction chamber 260 above the substrate 268. In such an arrangement, the substrate may be floating or grounded as the plasma potential will adjust itself, if all the other reactor components are insulating, so that the electron and ion flux to the substrate 268 are equal.

This arrangement has several advantages. For example, because the plasma is inductively coupled, the plasma potential is low, which reduces sputtering. In addition, because the plasma is located directly above the substrate 268, a uniform concentration of even short-lived radicals or excited species can be achieved at the substrate surface.

Figure 9:
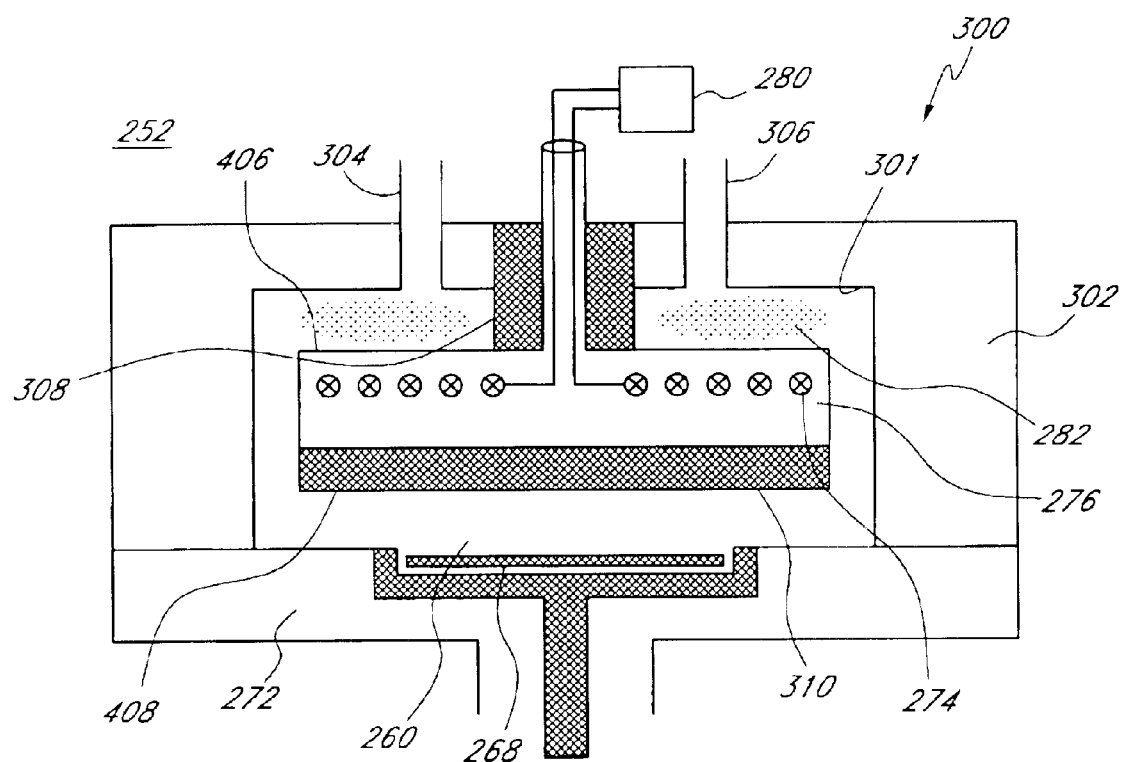
FIG. 9 is a cross-sectional side view of modified plasma enhanced ALD reactor having certain features and advantages according to the present invention.

FIG. 9 illustrates another embodiment of a plasma-enhanced ALD reactor 300. Like numbers are used to refer to parts similar to those of FIG. 8. In this embodiment, the reaction chamber 260 is defined by a recess 301 formed in a chamber wall 302. As with the previous embodiment, the substrate 268 is positioned in the reaction chamber 260 on the susceptor 270, which is positioned within the susceptor lift mechanism 272. The susceptor lift mechanism 272 is configured to move the substrate 268 into and out of the reaction chamber 260 and to seal the reaction chamber 260 during processing.

A precursor inlet 304 is provided for connecting the reaction chamber 260 to precursor source (not shown). Although, not illustrated, it should be appreciated that the reactor 300 can include a separate purge inlet and/or one or more precursor inlets for providing a purging gas or additional precursors to the reaction chamber 260. A gas outlet 306 is preferably also provided for removing material from the reaction chamber 260.

In the illustrated embodiment, the RF coil 274 and enclosure 276 are positioned in the reaction chamber 260 such that the precursor from the inlet 304 must flow over, around and under the RF coil 274 in order to flow over the substrate 268. As such, a flow guide, 308 is positioned in the reactor chamber 260 to guide precursor around the RF coil in one direction. Although not illustrated, it should be appreciated that, in the illustrated arrangement, the flow guide 308 forms a channel above an upper surface 406 the RF coil 274 to guide the precursor horizontally in one direction over the RF coil 274. The precursor then flows vertically along a portion of the RF coil 274, at which point the flow is directed horizontally and expanded such that the precursor flows in one direction substantially horizontally over the substrate 268 and below a lower surface 408 of the RF coil 274. Downstream of the substrate 268, the flow is guided in a vertical upward direction and then the flow is directed horizontally over the RF coil 274 to the outlet 306. In a modified embodiment, the outlet 306 can be located below the RF coil 274.

This illustrated embodiment has several advantages. For example, as compared to the embodiments of FIGS. 7A–7B, the flow path for the precursor is less restrictive. As such, it results in less recombination of excited species en rout to the substrate. Additionally, it is easier to purge the horizontal flow path for the precursor in between pulses.

A conducting plate 310 is positioned on the bottom of the RF enclosure 276 such that the plasma 282 is generated only above the RF coil 274. In addition, because, the space between the conducting plate 310 and the substrate 268 is preferably smaller than the dark space necessary for a plasma to exist under the prevailing conditions, the plasma is only generated in the larger space above the RF coil 274.

The illustrated embodiment has several advantages. For example, because the plasma is not generated directly above the substrate, sputtering is less of a concern and thus this embodiment is particularly useful for processing substrates with sensitive devices (e.g., gate stacks) and/or front-end applications where plasma damage is particularly harmful.

In the illustrated embodiment, a plasma 282 is also generated on the outlet side of the reactor. However, it should be appreciated, that in a modified embodiment, the plasma 282 on the outlet side can be eliminated.

Figure 10:
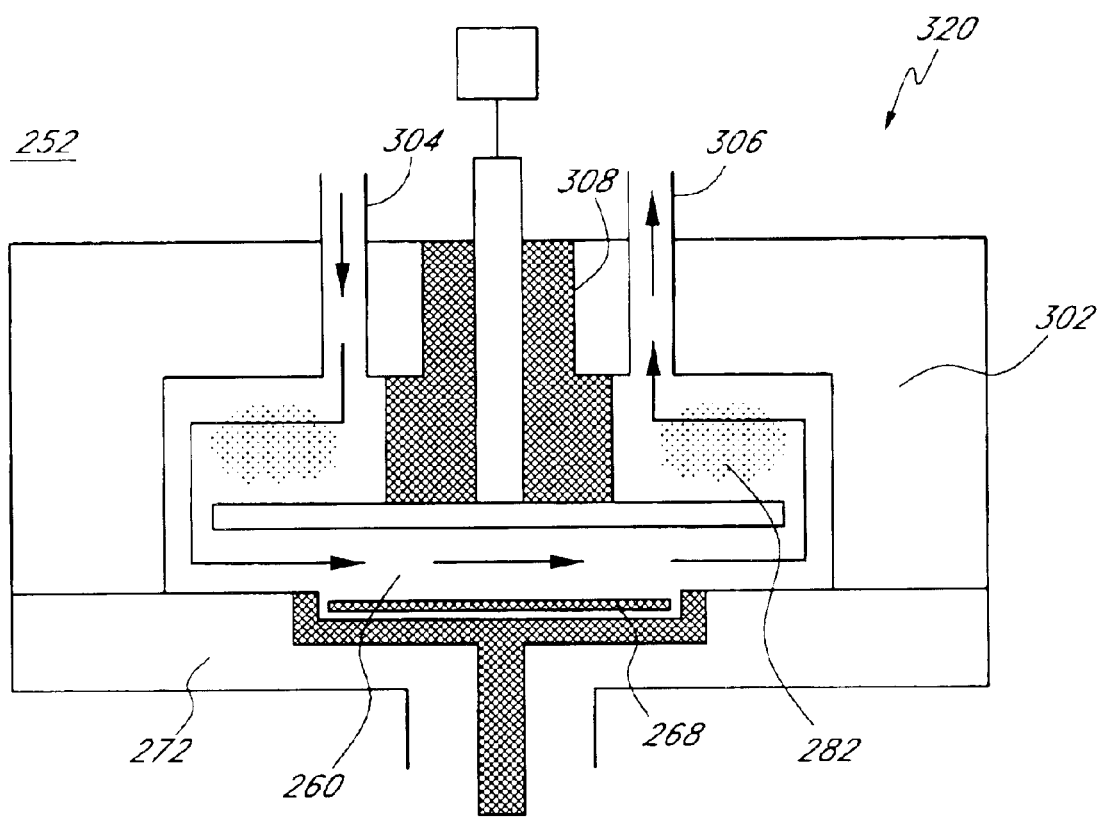
FIG. 10 is a cross-sectional side view of another modified plasma enhanced ALD reactor having certain features and advantages according to the present invention.

FIG. 10 illustrates another embodiment of a reactor that utilizes plasma. This embodiment is similar to the embodiment of FIG. 9. As such, like numbers will be used. In this embodiment, the plasma is capacitively coupled. As such, a capacitor plate 303 is positioned in the reaction chamber 260. The upper chamber walls 302 are grounded and conducting such that the plasma 282 is generated in the space above the capacitor plate 303 and the upper chamber 302. As with the embodiment of FIG. 10, the flow guide 308 guides precursor around the capacitor plate 303 to the space above the substrate 268 such that the precursor flows over the substrate in substantially horizontal direction.

Figure 11:
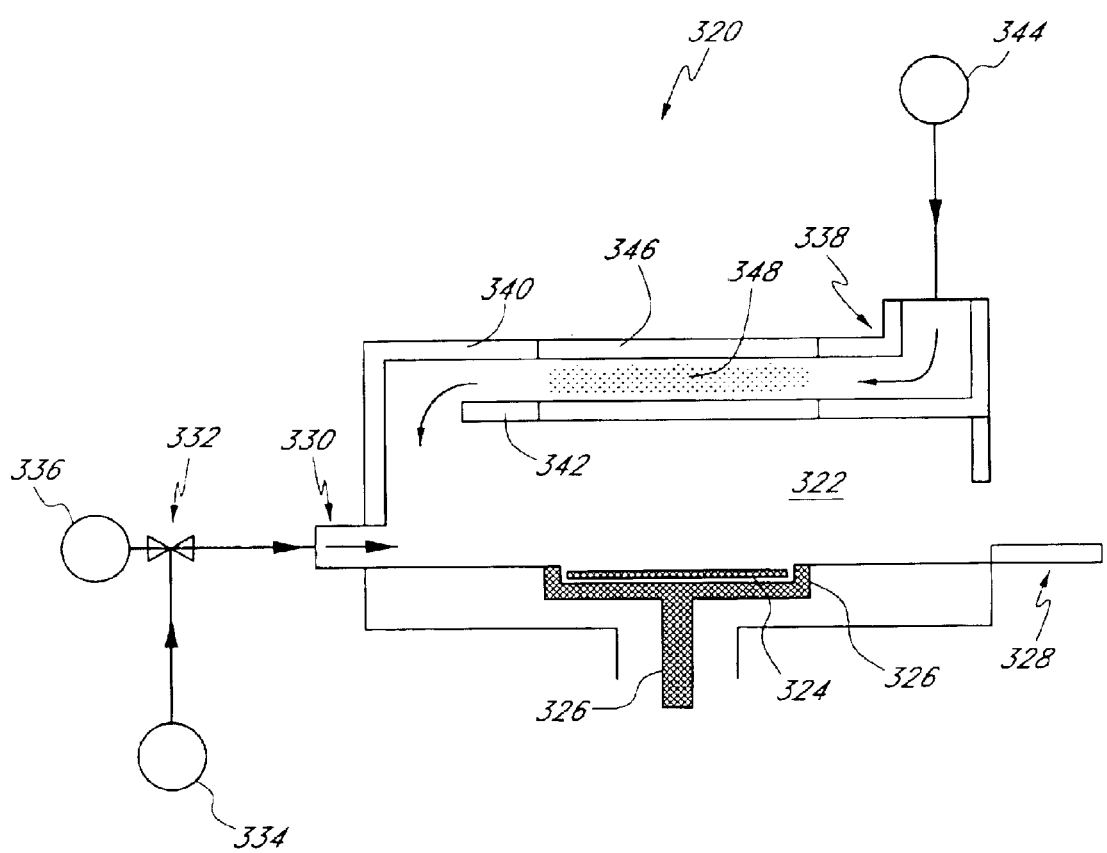
FIG. 11 is a cross-sectional side view of yet another modified plasma enhanced ALD reactor having certain features and advantages according to the present invention.

FIG. 11 is a schematic illustration of yet another embodiment of a plasma-enhanced ALD reactor 320. In this embodiment, the reactor 320 defines a reaction space 322 in which a substrate 324 in positioned on a susceptor 326. A load lock 328 is provided for moving the substrate 324 in and out of the reaction space 322.

The reactor includes a first inlet 330. In the illustrated embodiment, the first inlet 330 is in communication with a three-way valve 332, which is, in turn, in communication with a first precursor source 334 and a purging gas source 336. As will be explained in more detail below, the first precursor is preferably a metal precursor.

The reactor 320 also includes a second inlet 338. In the illustrated embodiment, the second inlet 338 is formed between an upper wall 340 of the reactor 320 and an intermediate wall 342. The second inlet 338 is in communication with a second precursor source 344, which is preferably a non-metal precursor. Optionally, the second inlet is also in communication with a purging gas source (not shown). The second inlet 338 includes a pair of electrodes 346 for producing a plasma 348 in the second inlet 338 above the reaction space 322. The reactor also includes an exhaust line 347 for removing material from the reaction space 322.

In a first stage, the first precursor is supplied to the reaction chamber 322. Specifically, the three-way valve 332 is opened such that the first metallic precursor can flow from the first precursor source 334 into the reaction chamber 322 while the second supply source 344 is kept closed. During this stage, the first metallic precursor is adsorbed on the active sites of the substrate 324 to form an adsorbed monolayer. During a second stage, the excess first precursor and any by-product is removed from the reactor 320. This is accomplished by shutting off the first precursor flow while continuing the flow of purge gas through the three-way valve 332. In a third stage, the second precursor is supplied to the reaction chamber 322. Specifically, the second precursor supply source 344 is opened and the electrodes 346 are activated to generate a plasma 348 in the second inlet 338. The reactants generated by the plasma 348 are highly reactive. As such, the adsorbed monolayer of the first precursor reacts instantly with the reactants of the second precursor that are introduced into the chamber 322. This produces the desired thin film on the substrate 324. The reaction terminates once the entire amount of the adsorbed first precursor on the substrate has been reacted. In a fourth stage, the excess second precursor and any by-product is removed from the reaction chamber 322. This is accomplished by shutting off the second precursor while the purging flow from the purging source 336 is turned on. In a modified arrangement, the purging gas source (not shown) in communication with the second inlet 338 is turned on and the purging gas pushes any residual second precursor gas away from the space between the electrodes 346 towards the reaction chamber 322 until essentially all of the excess second precursor and any reaction by-product have left the reactor. The cycle described above can be repeated as necessary to grow the film to a desired thickness. Of course, purge phases can be replaced with evacuation phases.

The illustrated embodiment has several advantages. For example, because the electrodes 346 are positioned in the second inlet 338, they are not exposed to the metal precursor. As such, the electrodes 346 do not become short-circuited, as may happen if an electrically conductive film is deposited on the electrodes 346.

Of course, the foregoing description is that of preferred embodiments of the invention and various changes, modifications, combinations and sub-combinations may be made without departing from the spirit and scope of the invention, as defined by the appended claims.

We claim:

1. A reactor configured to subject a substrate to alternately repeated surface reactions of vapor-phase reactants, comprising:

a reaction chamber that defines a reaction space;

a substrate that is positioned within the reaction chamber;

an plasma generating apparatus having an upper surface and a lower surface, the plasma generating apparatus being positioned in the reaction chamber such that a plasma is generated between the upper surface of the plasma generating apparatus and an upper wall of reaction chamber with no plasma being generated between the lower surface of the plasma generating apparatus and the substrate;

a first precursor source that is in communication with the reaction space through an inlet; and a flow guide that is configured to direct the first precursor over the upper surface of the plasma generating apparatus, along a side of the plasma generating apparatus and to a space between the lower surface of the plasma generating apparatus and the substrate, the first precursor flowing substantially in a first direction, which is substantially parallel to the substrate.

2. A reactor as in claim 1, wherein the plasma generating apparatus is configured to produce an inductively coupled plasma.

3. A reactor as in claim 2, wherein the lower surface of the plasma generating apparatus comprises a conducting plate.

4. A reactor as in claim 1, wherein the plasma generating apparatus is configured to produce a capacitively coupled plasma.

5. A reactor as in claim 1, wherein the substrate is positioned on a susceptor.

6. A reactor as in claim 5, wherein the susceptor is positioned within a susceptor lift mechanism.

7. A reactor as in claim 6, wherein the susceptor lift mechanism is configured to seal the reaction chamber during processing.

8. A reactor as in claim 1, further comprising a load lock for moving the substrate in and out of the reaction space.

9. A reactor as in claim 1, further comprising a second precursor source that is in communication with the reaction space through a second inlet.

10. A reactor as in claim 9, wherein the first precursor source comprises a non-metal precursor and the second precursor source comprises a metal precursor.

11. A reactor as in claim 10, wherein the reactor is configured such that the second precursor from the second inlet does not flow over the upper surface of the plasma generating apparatus.

12. A reactor as in claim 11, further comprising a purging gas source.

13. A reactor as in claim 12, wherein the purging gas source is in communication with the reaction space through the second inlet.

* * * * *

UNITED STATES PATENT AND TRADEMARK OFFICE
CERTIFICATE OF CORRECTION

PATENT NO. : 6,820,570 B2
DATED : November 23, 2004
INVENTOR(S) : Olli Kilpela et al.

It is certified that error appears in the above-identified patent and that said Letters Patent is hereby corrected as shown below:

Title page,
Item [73], Assignee, delete "Nobel Biocare Services AG, Glattbrug (CH)"
insert -- ASM International N.V., Bilthoven Netherlands --.

Signed and Sealed this

Seventh Day of February, 2006

JON W. DUDAS
*Director of the United States Patent and Trademark Office*